(12) United States Patent
Kim et al.

(10) Patent No.: US 12,310,177 B2
(45) Date of Patent: May 20, 2025

(54) DISPLAY DEVICE WITH WINDOW HAVING STACK OF TRANSPARENT AND LIGHT-BLOCKING PATTERNS, AND METHOD OF MANUFACTURING THE SAME

(71) Applicant: Samsung Display Co., LTD., Yongin-si (KR)

(72) Inventors: Tecksoo Kim, Seongnam-si (KR); Kangyoon Kim, Hwaseong-si (KR); Bang-Geul Choi, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 751 days.

(21) Appl. No.: 17/568,284

(22) Filed: Jan. 4, 2022

(65) Prior Publication Data

US 2023/0017967 A1    Jan. 19, 2023

(30) Foreign Application Priority Data

Jul. 13, 2021  (KR) ........................ 10-2021-0091394

(51) Int. Cl.
*H10K 59/126* (2023.01)
*H10K 59/12* (2023.01)
(Continued)

(52) U.S. Cl.
CPC ......... *H10K 59/126* (2023.02); *H10K 59/121* (2023.02); *H10K 59/65* (2023.02); *H10K 71/00* (2023.02); *H10K 59/1201* (2023.02)

(58) Field of Classification Search
CPC .... H10K 50/85; H10K 50/86; H10K 59/1201; H10K 59/121; H10K 59/126; H10K 59/65; H10K 71/00
(Continued)

(56) References Cited

U.S. PATENT DOCUMENTS

2011/0140090 A1   6/2011  Jeong et al.
2020/0186688 A1*  6/2020  Chen .................. H04N 23/54
(Continued)

FOREIGN PATENT DOCUMENTS

KR   10-2011-0065891   6/2011
KR   10-2017-0047094   5/2017
(Continued)

OTHER PUBLICATIONS

Korean Office Action dated Mar. 10, 2025, in Korean Patent Application No. 10-2021-0091394 [including English Machine Translation].

*Primary Examiner* — Matthew E. Gordon
(74) *Attorney, Agent, or Firm* — KILE PARK REED & HOUTTEMAN PLLC

(57) ABSTRACT

A method of manufacturing a display device includes preparing a window including a hole area, a boundary area surrounding the hole area, and a display area surrounding the boundary area, forming a first light blocking pattern on the window, the first light blocking pattern overlapping the boundary area in a plan view and blocking light, forming a transparent pattern on the first light blocking pattern, the transparent pattern overlapping the hole area in a plan view and transmitting light, and forming a second light blocking pattern on the transparent pattern, the second light blocking pattern overlapping the boundary area in a plan view and blocking light.

19 Claims, 13 Drawing Sheets

(51) Int. Cl.
*H10K 59/121* (2023.01)
*H10K 59/65* (2023.01)
*H10K 71/00* (2023.01)

(58) Field of Classification Search
USPC .................................................. 257/5, 40
See application file for complete search history.

(56) References Cited

U.S. PATENT DOCUMENTS

| | | | | |
|---|---|---|---|---|
| 2020/0285123 | A1* | 9/2020 | Kim | H10K 50/865 |
| 2020/0328375 | A1* | 10/2020 | Won | H10K 59/60 |
| 2020/0403186 | A1* | 12/2020 | Choi | H10K 59/40 |
| 2022/0190043 | A1* | 6/2022 | Ge | H10K 50/865 |
| 2023/0011316 | A1* | 1/2023 | Xu | H10K 50/85 |
| 2023/0128802 | A1 | 4/2023 | Kim | |
| 2023/0213689 | A1* | 7/2023 | Shim | H10K 59/65 |
| | | | | 345/173 |
| 2023/0350456 | A1* | 11/2023 | Wang | H10K 59/8792 |

FOREIGN PATENT DOCUMENTS

| | | |
|---|---|---|
| KR | 10-2020-0108140 | 9/2020 |
| KR | 10-2021-0103629 | 8/2021 |

\* cited by examiner

DISPLAY DEVICE WITH WINDOW HAVING STACK OF TRANSPARENT AND LIGHT-BLOCKING PATTERNS, AND METHOD OF MANUFACTURING THE SAME

CROSS-REFERENCE TO RELATED APPLICATION(S)

This application claims priority to and benefits of Korean Patent Application No. 10-2021-0091394 under 35 U.S.C. § 119, filed on Jul. 13, 2021 in the Korean Intellectual Property Office, the entire contents of which are incorporated herein by reference.

BACKGROUND

1. Technical Field

Implementations of the disclosure relate generally to a display device and a method of manufacturing the same.

2. Description of the Related Art

A functional module (for example, a camera module, etc.) may be disposed on a display device so that a user can perform various functions using the display device. In order for the functional module to function efficiently, it is necessary to increase the transmittance of external light incident on the functional module. In order to enlarge the display area of the display device, a structure in which the functional module is disposed to overlap the display area has recently been developed.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments provide a display device.

Embodiments provide a method of manufacturing the display device.

A method of manufacturing a display device according to an embodiment may include preparing a window including a hole area, a boundary area surrounding the hole area, and a display area surrounding the boundary area; forming a first light blocking pattern on the window, the first light blocking pattern overlapping the boundary area in a plan view and blocking light; forming a transparent pattern on the first light blocking pattern, the transparent pattern overlapping the hole area in a plan view and transmitting light; and forming a second light blocking pattern on the transparent pattern, the second light blocking pattern overlapping the boundary area in a plan view and blocking light.

According to an embodiment, the transparent pattern may be formed after the first light blocking pattern is formed, and the second light blocking pattern may be formed after the transparent pattern is formed.

According to an embodiment, the first light blocking pattern, the transparent pattern, and the second light blocking pattern may overlap each other in a plan view in the boundary area of the window.

According to an embodiment, the transparent pattern may be formed between the first light blocking pattern and the second light blocking pattern in the boundary area of the window.

According to an embodiment, the transparent pattern may be exposed in the hole area of the window.

According to an embodiment, the transparent pattern may have a substantially circular shape and a substantially sawtooth shape surrounding the substantially circular shape in a plan view.

According to an embodiment, the first light blocking pattern may have a substantially first donut shape in a plan view, and the second light blocking pattern may have a substantially second donut shape in a plan view.

According to an embodiment, a diameter of the substantially circular shape of the transparent pattern may be greater than or equal to an inner diameter of the first light blocking pattern.

According to an embodiment, a maximum length of the transparent pattern may be less than or equal to an outer diameter of the second light blocking pattern.

According to an embodiment, a length of the substantially sawtooth shape of the transparent pattern may be less than or equal to a width of the second light blocking pattern.

According to an embodiment, an outer diameter of the second light blocking pattern may be less than or equal to an outer diameter of the first light blocking pattern.

According to an embodiment, an inner diameter of the second light blocking pattern may be greater than or equal to an inner diameter of the first light blocking pattern.

According to an embodiment, a length of the substantially sawtooth shape may be greater than about 0.05 mm and is less than about 1 mm.

According to an embodiment, the transparent pattern may include silicon oxide layers and titanium oxide layers alternately stacked, and the window may contact at least one of the silicon oxide layers.

According to an embodiment, the method may further include adhering the window to the display panel so that the display panel faces the transparent pattern.

According to an embodiment, a hole may be formed in the display panel overlapping the hole area of the window in a plan view.

A display device according to an embodiment may include a window including a hole area, a boundary area surrounding the hole area, and a display area surrounding the boundary area; a display panel disposed below the window, and including a hole overlapping the hole area of the window in a plan view; a first light blocking pattern disposed between the window and the display panel, and overlapping the boundary area in a plan view; a transparent pattern disposed between the window and the display panel, and overlapping the hole area in a plan view; and a second light blocking pattern disposed between the first light blocking pattern and the display panel, and overlapping the boundary area.

According to an embodiment, the first light blocking pattern, the transparent pattern, and the second light blocking pattern may overlap each other in the boundary area of the window in a plan view.

According to an embodiment, the transparent pattern may be formed between the first light blocking pattern and the second light blocking pattern in the boundary area of the window.

Therefore, according to the method of manufacturing a display device according to embodiments, a transparent pattern may be formed after the first light blocking pattern is formed, and a second light blocking pattern may be formed after the transparent pattern is formed. As the first light blocking pattern is formed between the window and the transparent pattern, the substantially sawtooth shape of the transparent pattern may not be visually recognized through the window. As the substantially sawtooth shape may be completely covered or overlapped by the first and second light blocking patterns, bubbles may not be generated while the window is adhered to a lower structure. As the display device may include the transparent pattern, transmittance of external light incident to the hole area of the window may increase.

It is to be understood that both the foregoing general description and the following detailed description are examples and are intended to provide further explanation of the disclosure and as claimed.

BRIEF DESCRIPTION OF THE DRAWINGS

The accompanying drawings, which are included to provide a further understanding of the disclosure and are incorporated in and constitute a part of this specification, illustrate embodiments of the disclosure together with the description in which.

DETAILED DESCRIPTION OF THE EMBODIMENTS

Figure 1:
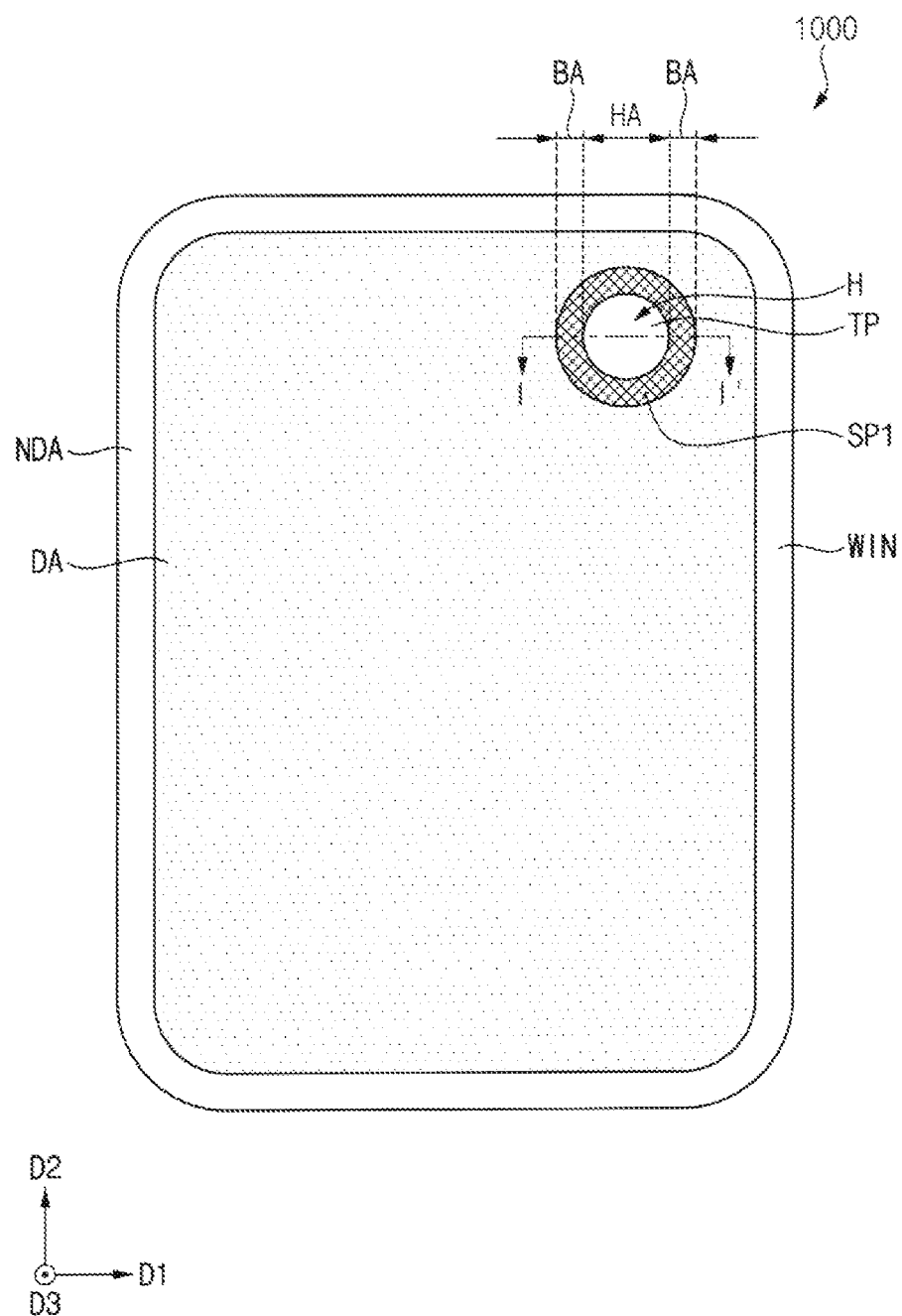
FIG. 1 is a schematic plan view illustrating a display device according to an embodiment.

Illustrative, non-limiting embodiments will be more clearly understood from the following detailed description in conjunction with the accompanying drawings.

In the drawings, sizes, thicknesses, ratios, and dimensions of the elements may be exaggerated for ease of description and for clarity. Like numbers refer to like elements throughout.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, element The phrase "in a plan view" means viewing the object from the top, and the phrase "in a schematic cross-sectional view" means viewing a cross-section of which the object is vertically cut from the sides, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic plan view illustrating a display device according to an embodiment.

Referring to FIG. 1, a display device 1000 according to an embodiment may be divided into a hole area HA, a boundary area BA, a display area DA, and a non-display area NDA.

In an embodiment, the hole area HA may be circular, the boundary area BA may be positioned or disposed to surround the hole area HA, the display area DA may be positioned or disposed to surround the boundary area BA, and the non-display area NDA may be positioned or disposed to surround the display area DA. As shown in FIG. 1, the display area DA and the non-display area NDA may have a rectangular shape with rounded corners. It is to be understood that the shapes disclosed herein also include shapes substantial to those shapes disclosed herein. A functional module (for example, a functional module FM in FIG. 3) and a transparent pattern TP may be disposed in the hole area HA. The boundary area BA may define a boundary between the hole area HA and the display area DA, and at least one light blocking pattern (for example, a first light blocking pattern SP1) may be disposed in the boundary area BA. At least one light emitting structure (for example, a light emitting structure 300 in FIG. 3) may be disposed in the display area DA, and an image may be displayed in the display area DA. At least one driver that transmits signals and voltages to the display area DA and a controller that controls the driver may be disposed in the non-display area NDA.

However, the disclosure is not limited thereto. For example, in an embodiment, the light emitting structure 300 may be disposed in the hole area HA and the boundary area BA, and an image may be displayed in the hole area HA and the boundary area BA.

Figure 2:
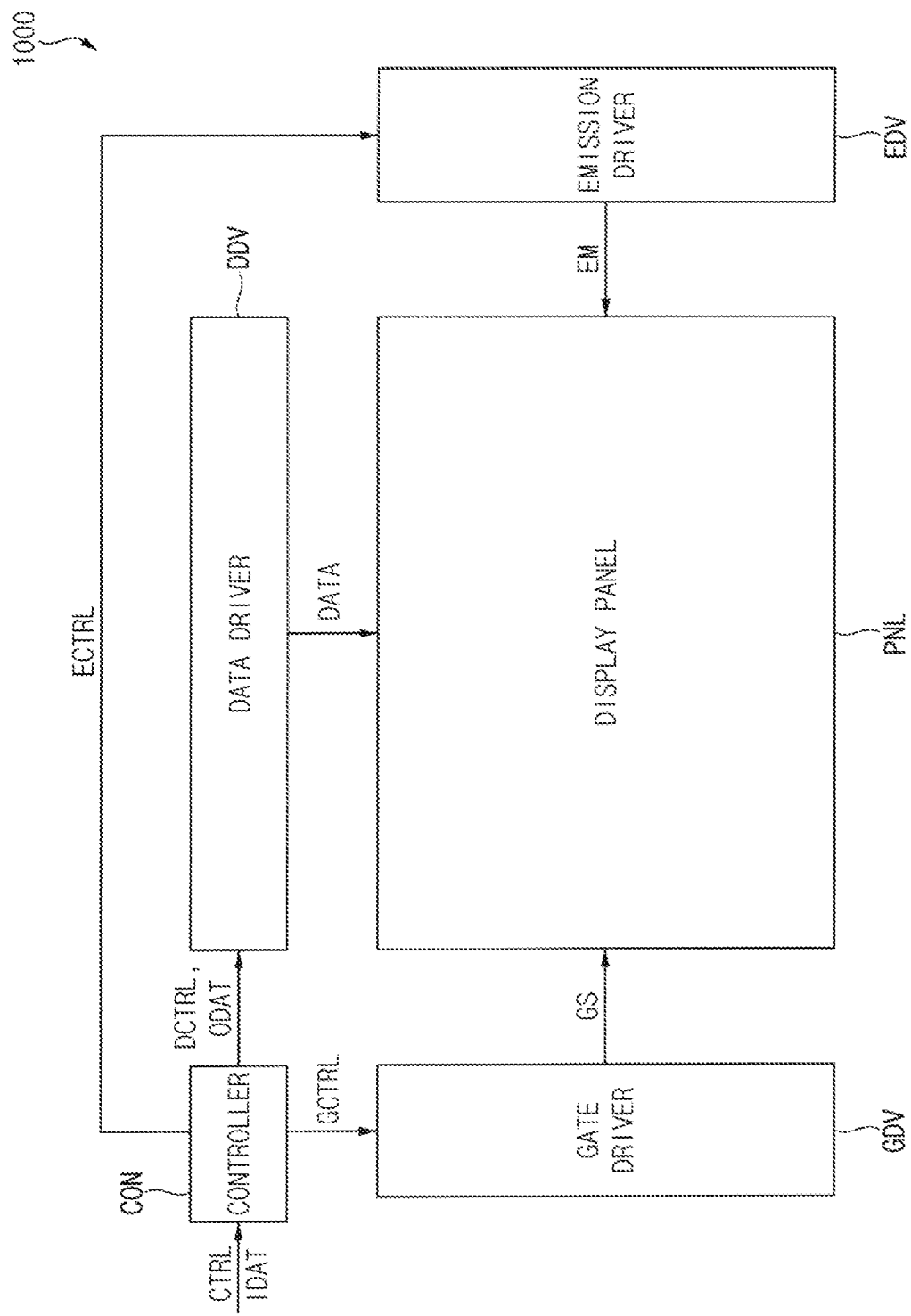
FIG. 2 is a block diagram illustrating the display device of FIG. 1.

FIG. 2 is a block diagram illustrating the display device of FIG. 1.

Referring to FIG. 2, the display device 1000 may include a display panel PNL, a data driver DDV, a gate driver GDV, an emission driver EDV, and a timing controller CON.

The light emitting structure 300 and a thin film transistor (for example, a thin film transistor 200 in FIG. 4) transmitting a driving current to the light emitting structure 300 may be disposed in the display panel PNL. A data line providing a data voltage DATA to the thin film transistor 200, a gate line providing a gate signal GS to the thin film transistor 200, and an emission control line providing an emission control signal EM to the thin film transistor 200 may be disposed in the display panel PNL.

The data driver DDV may receive an output image data ODAT and a data control signal DCTRL from the timing controller CON, and may generate the data voltage DATA. The gate driver GDV may receive a gate driving signal GCTRL from the timing controller CON and may generate the gate signal GS. The emission driver EDV may receive an emission driving signal ECTRL from the timing controller CON and may generate the emission control signal EM. The timing controller CON may receive a control signal CTRL and input image data IDAT from an external device, and may control the data driver DDV, the gate driver GDV, and the emission driver EDV.

For example, the data driver DDV and the timing controller CON may be disposed on a flexible printed circuit board, the gate driver GDV may be mounted in the non-display area NDA adjacent to the left side of the display area DA, and the emission driver EDV may be mounted in the non-display area NDA adjacent to the right side of the display area DA. However, the positions of the data driver DDV, the gate driver GDV, the emission driver EDV, and the timing controller CON are not limited thereto.

The data voltage DATA may be written into the thin film transistor 200 in response to the gate signal GS. The driving current may be transmitted to the light emitting structure 300 in response to the emission control signal EM. The light emitting structure 300 may emit light having a luminance corresponding to the driving current.

Figure 3:
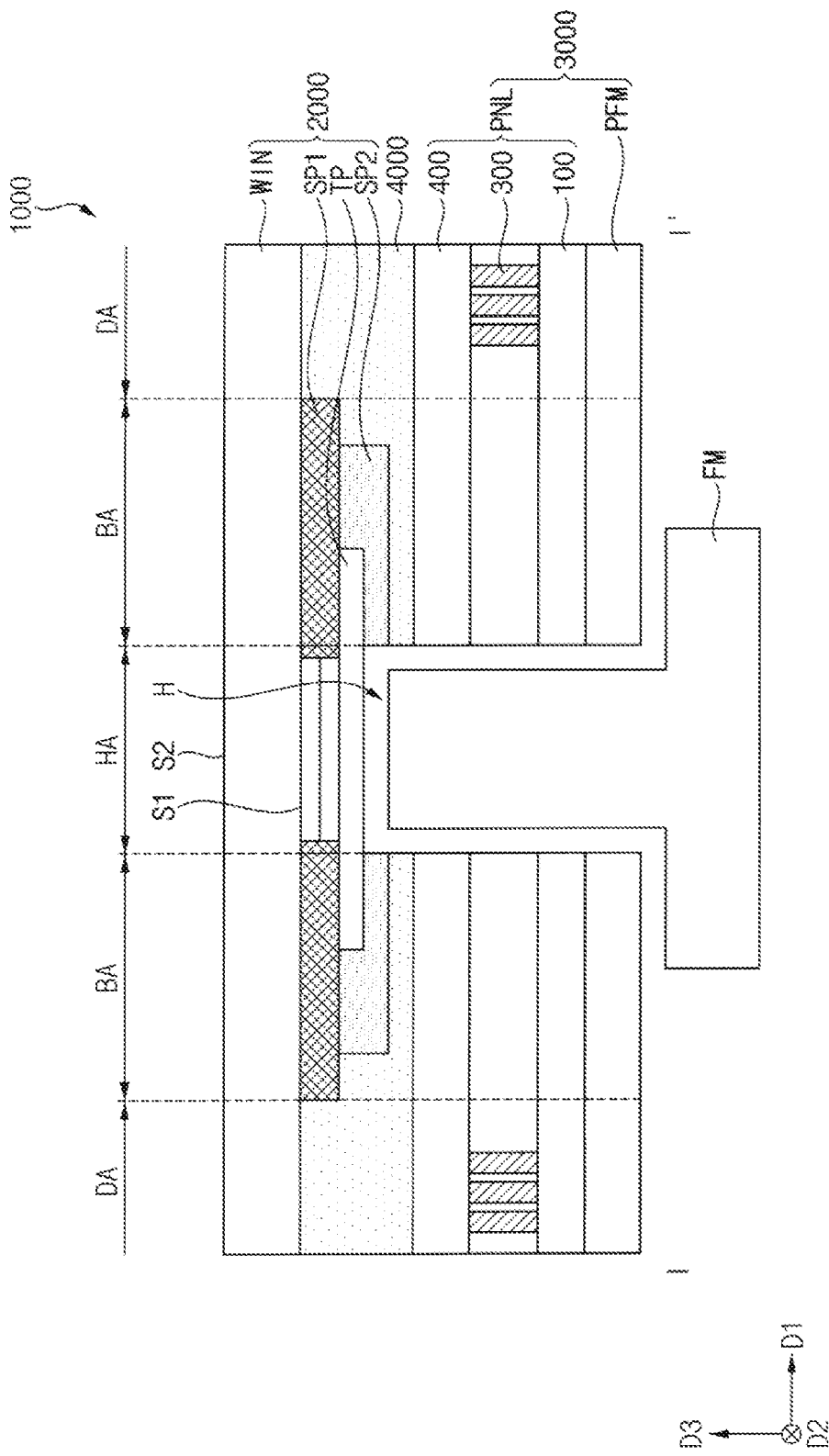
FIG. 3 is a schematic cross-sectional view taken along line I-I' of FIG. 1.

FIG. 3 is a schematic cross-sectional view taken along line I-I' of FIG. 1.

Referring to FIGS. 1 and 3, the display device 1000 may include a lower structure 3000, a window module 2000, and an adhesive layer 4000. The lower structure 3000 may include the display panel PNL and a protective film PFM. The window module 2000 may include a window WIN, the first light blocking pattern SP1, the transmission pattern TP, and a second light blocking pattern SP2.

The display panel PNL may include a base substrate 100, the light emitting structure 300, and an encapsulation layer 400. A hole H may be formed in the display panel PNL overlapping the hole area HA. The display panel PNL will be described in detail with reference to FIGS. 4 and 5.

The protective film PFM may be disposed under or below the display panel PNL and may support the display panel PNL. In an embodiment, the protective film PFM may be formed of plastic. For example, examples of the plastic that can be used as the protective film PFM may be polyethylene terephthalate ("PET"), polyimide ("PI"), polyethersulfone ("PS"), polyacrylate ("PAR"), polyetherimide ("PEI"), polyethylene naphthalate ("PEN"), polyphenylene sulfide ("PPS"), polyarylate, polycarbonate ("PC"), polyarylene ether sulfone, and the like within the spirit and the scope of the disclosure. These may be used alone or in combination with each other.

The functional module FM may overlap the hole area HA and may be disposed inside the hole H. For example, the functional module FM may include a camera module capable of capturing an image of an object, a face recognition sensor module capable of detecting a user's face, a pupil recognition sensor module capable of detecting a user's pupil, an acceleration sensor module capable of detecting a movement of the display device 1000, and a proximity sensor module capable of detecting whether an object is in proximity, and the like within the spirit and the scope of the disclosure.

The window WIN may be disposed on the lower structure 3000. The window WIN may protect the lower structure 3000 and may allow external light to enter the functional module FM. The window WIN may include a first surface S1 and a second surface S2. The first surface 51 may face the lower structure 3000, and the second surface S2 may be opposite to the first surface S1 and may be exposed to the outside. The window WIN may be formed of transparent glass or transparent plastic. For example, examples of the material that can be used as the window WIN may be ultra-thin tempered glass ("UTG"), polyethylene terephthalate ("PET"), polyimide ("PI"), polyethersulfone ("PS"), polyacrylate ("PAR"), polyetherimide ("PEI"), polyethylene naphthalate ("PEN"), polyphenylene sulfide ("PPS"), polyarylate, polycarbonate ("PC"), polyarylene ether sulfone, and the like within the spirit and the scope of the disclosure. These may be used alone or in combination with each other.

The first light blocking pattern SP1 may be disposed under or below the window WIN. The first light blocking pattern SP1 may overlap the boundary area BA. The first light blocking pattern SP1 may block light. Accordingly, the first light blocking pattern SP1 may prevent components (for example, metal lines) formed in the display panel PNL from being visually recognized to the outside. In an embodiment, the first light blocking pattern SP1 may be formed of a material that blocks light. For example, examples of the material that can be used as the first light blocking pattern SP1 may be carbon black, phenylene black, aniline black, cyanine black, nigrosinic acid black, and a photoresist composition. These may be used alone or in combination with each other.

The transparent pattern TP may be disposed below the window WIN and below the first light blocking pattern SP1. The transparent pattern TP may overlap the hole area HA and the boundary area BA. The transparent pattern TP may be exposed in the hole area HA, and may be covered or overlapped by the second light blocking pattern SP2 in the boundary area BA.

The transparent pattern TP may suppress reflection of external light and may increase transmittance of external light. In an embodiment, the transparent pattern TP may include layers having different refractive indices. For example, the transparent pattern TP may have a structure in which silicon oxide ("SiO$_2$") layers and titanium oxide ("TiO$_2$") layers may be alternately stacked each other. As the refractive index of the silicon oxide layer and the refractive index of the titanium oxide layer are different from each other, the transparent pattern TP may have an anti-reflection ("AR") function.

However, the transparent pattern TP is not limited thereto. In an embodiment, the transparent pattern TP may have a structure in which inorganic oxide layers may be stacked each other. The inorganic oxide layers may have different refractive indices. The transparent pattern TP may reduce both the refractive index of the window module 2000 overlapping the hole area HA and the reflectance of the window module 2000 overlapping the hole area HA. Accordingly, transmittance of the window module 2000 overlapping the hole area HA may be increased.

The second light blocking pattern SP2 may be disposed below the first light blocking pattern SP1 and below the transparent pattern TP. The second light blocking pattern SP2 may overlap the boundary area BA. The second light blocking pattern SP2 may block light. As the second light blocking pattern SP2 adheres to the first light blocking pattern SP1, the transparent pattern TP may be supported and the shape of the transmission pattern TP may be maintained. In an embodiment, the second light blocking pattern SP2 may be formed of a material that blocks light and has an adhesive force. For example, examples of the material that can be used as the second light blocking pattern SP2 may be carbon black, phenylene black, aniline black, cyanine black, nigrosinic acid black, and a photoresist composition, and the like within the spirit and the scope of the disclosure. These may be used alone or in combination with each other.

In an embodiment, the first light blocking pattern SP1, the transparent pattern TP, and the second light blocking pattern SP2 may overlap each other in the boundary area BA. The transparent pattern TP may be formed between the first light blocking pattern SP1 and the second light blocking pattern SP2 in the boundary area BA. The shape of the transparent pattern TP may be stably maintained by the adhesive force between the first light blocking pattern SP1 and the second light blocking pattern SP2.

The adhesive layer 4000 may adhere the window module 2000 to the lower structure 3000. For example, examples of the material that can be used as the adhesive layer 4000 may include an optically transparent adhesive ("OCA"), an optically transparent adhesive resin ("OCR"), and a pressure-sensitive adhesive ("PSA").

Figure 4:
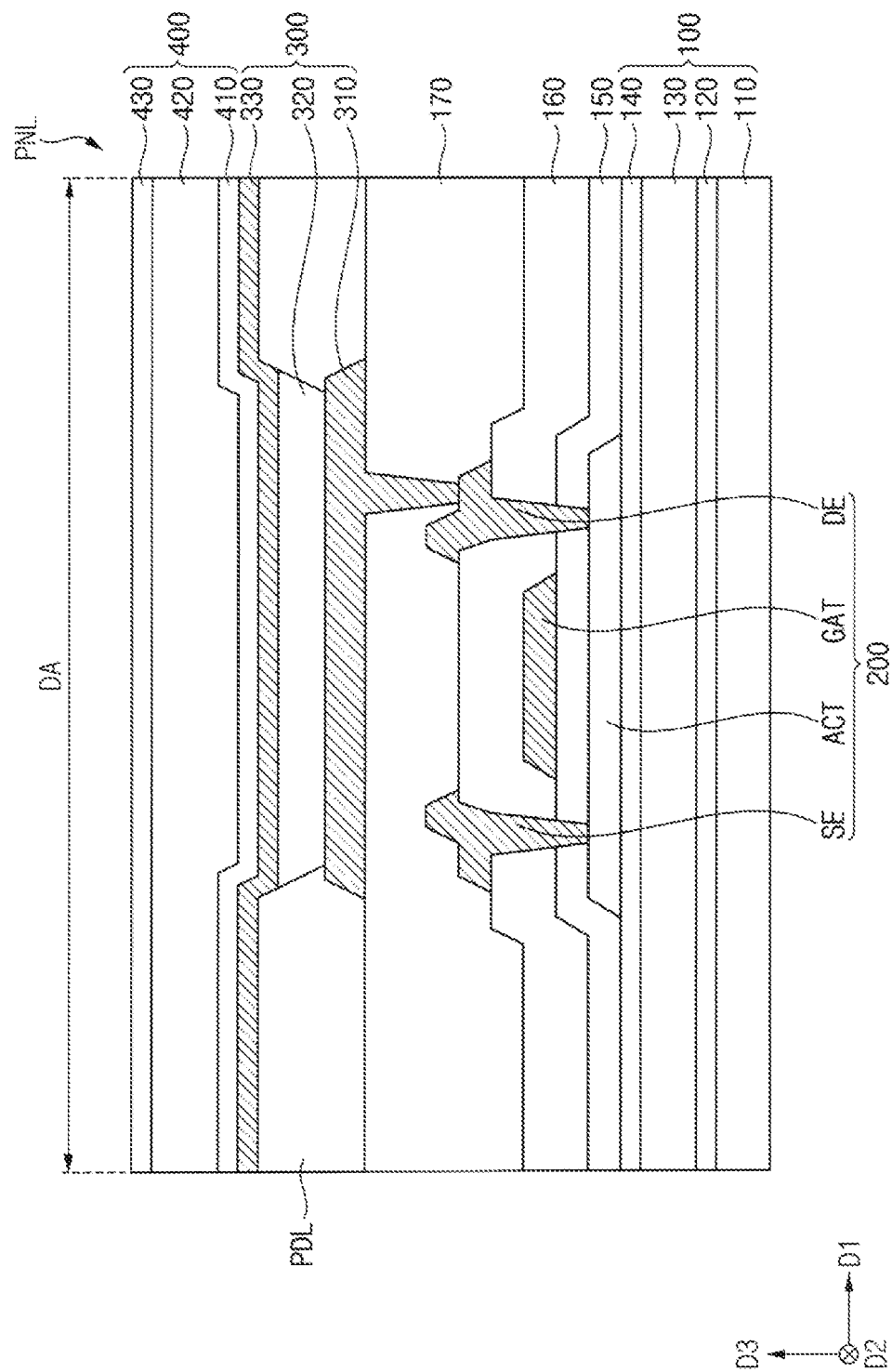
FIG. 4 and FIG. 5 are schematic cross-sectional views illustrating a display panel of FIG. 3.
Figure 5:
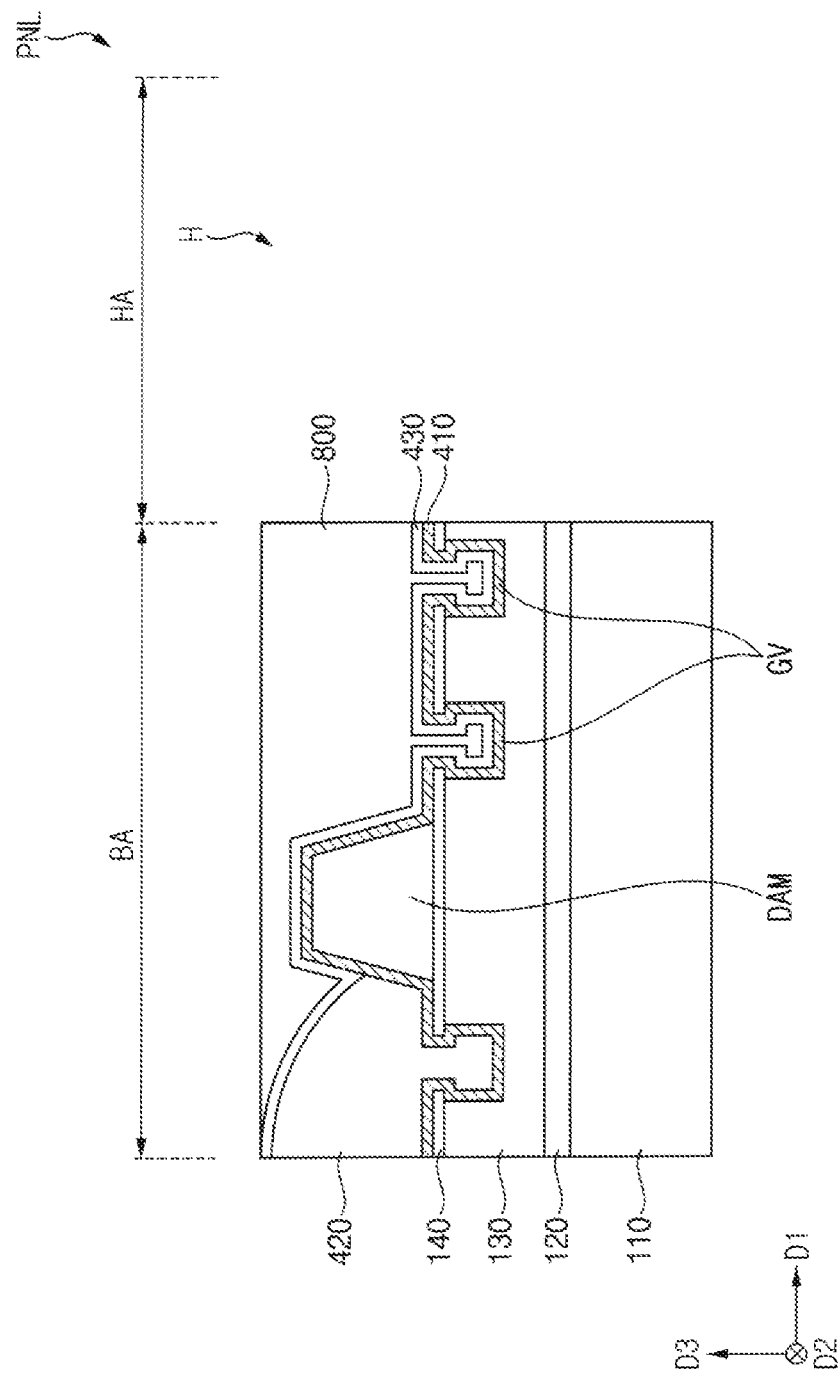

FIG. 4 and FIG. 5 are schematic cross-sectional views illustrating a display panel of FIG. 3. FIG. 4 is a schematic cross-sectional view illustrating a display panel overlapping a display area, and FIG. 5 is a schematic cross-sectional view illustrating a display panel overlapping a boundary area and a hole area.

Referring to FIG. 4, the display panel PNL may include the base substrate 100, the thin film transistor 200, a first insulating layer 150, a second insulating layer 160, a via insulating layer 170, the light emitting structure 300, and the encapsulation layer 400.

In an embodiment, the base substrate 100 may include a first substrate 110, a first barrier layer 120, a second substrate 130, and a second barrier layer 140. Since the base substrate 100 has a structure in which substrates and barrier layers may be sequentially stacked each other, the base substrate 100 may reduce the moisture permeability of the first and second substrates 110 and 130 and may prevent foreign matter from being diffused into the light emitting structure 300.

In an embodiment, the thin film transistor 200 may include an active pattern ACT, a gate electrode GAT, a source electrode SE, and a drain electrode DE. The light emitting structure 300 may include a first electrode 310, an emission layer 320, and a second electrode 330 The encapsulation layer 400 may include a first inorganic layer 410, an organic layer 420, and a second inorganic layer 430.

The first substrate 110 may be formed of a transparent or opaque material. In an embodiment, the first substrate 110 may be formed of glass, quartz, plastic, or the like within the spirit and the scope of the disclosure. Examples of the material that can be used as the plastic may be polyimide, polyethylene naphthalate, polyethylene terephthalate, polyarylate, polycarbonate, polyetherimide, polyethersulfone, and the like within the spirit and the scope of the disclosure. These may be used alone or in combination with each other.

The first barrier layer 120 may be disposed on the first substrate 110. For example, the first barrier layer 120 may be formed of a silicon compound such as amorphous silicon, silicon oxide, or silicon nitride.

The second substrate 130 may be disposed on the first barrier layer 120. For example, the second substrate 130 may include the same material or a similar material as the first substrate 110. The second barrier layer 140 may be disposed on the second substrate 130. For example, the second barrier layer 140 may include the same material or a similar material as the first barrier layer 120.

A buffer layer may be disposed on the second barrier layer 140. The buffer layer may prevent diffusion of metal atoms or impurities from the base substrate 100 into the active pattern ACT, and may control a heat transfer rate during a crystallization process for forming the active pattern ACT.

The active pattern ACT may be disposed on the buffer layer. The active pattern ACT may be formed of amorphous silicon, polycrystalline silicon, oxide silicon, or the like within the spirit and the scope of the disclosure. The active pattern ACT may be divided into a source area and a drain area doped with impurities, and a channel area between the source area and the drain area.

The first insulating layer 150 may be disposed on the buffer layer. The first insulating layer 150 may cover or overlap the active pattern ACT and may be formed to have substantially the same thickness along a profile of the active pattern ACT. For example, the first insulating layer 150 may be formed of an inorganic material such as silicon oxide, silicon nitride, or metal oxide. These may be used alone or in combination with each other.

The gate electrode GAT may be disposed on the first insulating layer 150. In an embodiment, the gate electrode GAT may overlap the channel area of the active pattern ACT. For example, the gate electrode GAT may be formed of a metal, an alloy, a metal nitride, a conductive metal oxide, a transparent conductive material, or the like within the spirit and the scope of the disclosure. These may be used alone or in combination with each other.

The second insulating layer 160 may be disposed on the first insulating layer 150. The second insulating layer 160 may cover or overlap the gate electrode GAT and may be disposed to have substantially the same thickness along a profile of the gate electrode GAT.

The source electrode SE and the drain electrode DE may be disposed on the second insulating layer 160. The source electrode SE may contact the source area of the active pattern ACT through a first contact hole formed in the first and second insulating layers 150 and 160. The drain electrode DE may contact the drain area of the active pattern ACT through a second contact hole formed in the first and second insulating layers 150 and 160. The source and drain electrodes SE and DE may include a metal, an alloy, a metal nitride, a conductive metal oxide, a transparent conductive material, or the like within the spirit and the scope of the disclosure. These may be used alone or in combination with each other.

The via insulating layer 170 may be disposed on the second insulating layer 160. The via insulating layer 170 may cover or overlap the source and drain electrodes SE and DE, and may have a substantially flat top surface without creating a step around the source and drain electrodes SE and DE. For example, the via insulating layer 170 may be formed of an organic material such as a photoresist, an acrylic resin, a polyimide-based resin, a polyamide-based resin, or a siloxane-based resin. These may be used alone or in combination with each other.

The first electrode 310 may be disposed on the via insulating layer 170. The first electrode 310 may have reflective or transmissive properties. For example, the first electrode 310 may include aluminum, an alloy containing aluminum, aluminum nitride, silver, an alloy containing silver, tungsten, tungsten nitride, copper, an alloy containing copper, nickel, chromium, chromium nitride, molybdenum, an alloy containing molybdenum, titanium, titanium nitride, platinum, tantalum, tantalum nitride, neodymium, scandium, strontium ruthenium oxide, indium tin oxide, indium zinc oxide, or the like within the spirit and the scope of the disclosure. These may be used alone or in combination with each other.

A pixel defining layer PDL may be disposed on the via insulating layer 170, and an opening exposing a top surface of the first electrode 310 may be formed in the pixel defining layer PDL. The pixel defining layer PDL may be formed of an organic material such as a photoresist, a polyacrylic resin, a polyimide-based resin, or an acrylic resin, or an inorganic material such as silicon oxide or silicon nitride. These may be used alone or in combination with each other.

The emission layer 320 may be disposed on the first electrode 310. In an embodiment, the emission layer 320 may have a multilayer structure including a hole injection layer, a hole transport layer, an organic light emitting layer, an electron transport layer, and an electron injection layer. The organic light emitting layer may include a light emitting material.

The second electrode 330 may be disposed on the emission layer 320. In an embodiment, the second electrode 330 may have a plate shape. The second electrode 330 may have transmissive or reflective properties. For example, the second electrode 330 may include aluminum, an alloy containing aluminum, aluminum nitride, silver, an alloy containing silver, tungsten, tungsten nitride, copper, an alloy containing copper, nickel, chromium, chromium nitride, molybdenum, an alloy containing molybdenum, titanium, titanium nitride, platinum, tantalum, tantalum nitride, neodymium, scandium, strontium ruthenium oxide, indium tin oxide, indium zinc oxide, or the like within the spirit and the scope of the disclosure. These may be used alone or in combination with each other.

The encapsulation layer 400 may prevent moisture and oxygen from penetrating into the light emitting structure 300 from the outside. For example, the encapsulation layer 400 may include the first inorganic layer 410, the organic layer 420, and the second inorganic layer 430.

The first inorganic layer 410 may be disposed on the second electrode 330 to have substantially the same thickness along a profile of the second electrode 330. The organic layer 420 may be disposed on the first inorganic layer 410, and may have a substantially flat top surface without creating a step around the first inorganic layer 410. The second inorganic layer 430 may be disposed on the organic layer 430.

Referring to FIG. 5, the hole H may be formed in the display panel PNL overlapping the hole area HA. The first substrate 110, the first barrier layer 120, the second substrate 130, the second barrier layer 140, the first inorganic layer 410, the organic layer 420, the second inorganic layer 430, a dam DAM, and a planarization insulating layer 800 may be disposed in the boundary area BA of the display panel PNL.

The dam DAM may be disposed in the boundary area BA on the second substrate 140 and may be positioned or disposed to surround the hole area HA. The dam DAM may prevent the organic layer 420 included in the encapsulation layer 400 from overflowing into the hole area HA. In other words, the organic layer 420 may be disposed outside the dam DAM. The dam DAM may have a structure in which organic material layers may be stacked each other. For example, the dam DAM may be formed together with the via insulating layer 170 and the pixel defining layer PDL.

A groove GV may be formed in the second substrate 140. The groove GV may be formed by removing a portion of the second barrier layer 140 and the second substrate 130 after the second barrier layer 140 is formed.

The first inorganic layer 410 and the second inorganic layer 430 included in the encapsulation layer 400 may extend to the boundary area BA in which the groove GV is formed. The first and second inorganic layers 410 and 430 may extend along the profile of the groove GV. Accordingly, an inflow path of moisture and oxygen flowing through the first and second inorganic layers 410 and 430 may be extended. A propagation path of cracks transmitted through the first and second inorganic layers 410 and 430 may be extended. Accordingly, the time for moisture, oxygen, and cracks to flow into the inside of the display device 1000 along the first and second inorganic layers 410 and 430 may be extended, and the reliability and the stability of the display device 1000 may be increased.

The planarization insulating layer 800 may be disposed on the second inorganic layer 430. For example, the planarization insulating layer 800 may have a substantially flat top surface.

Figure 10:
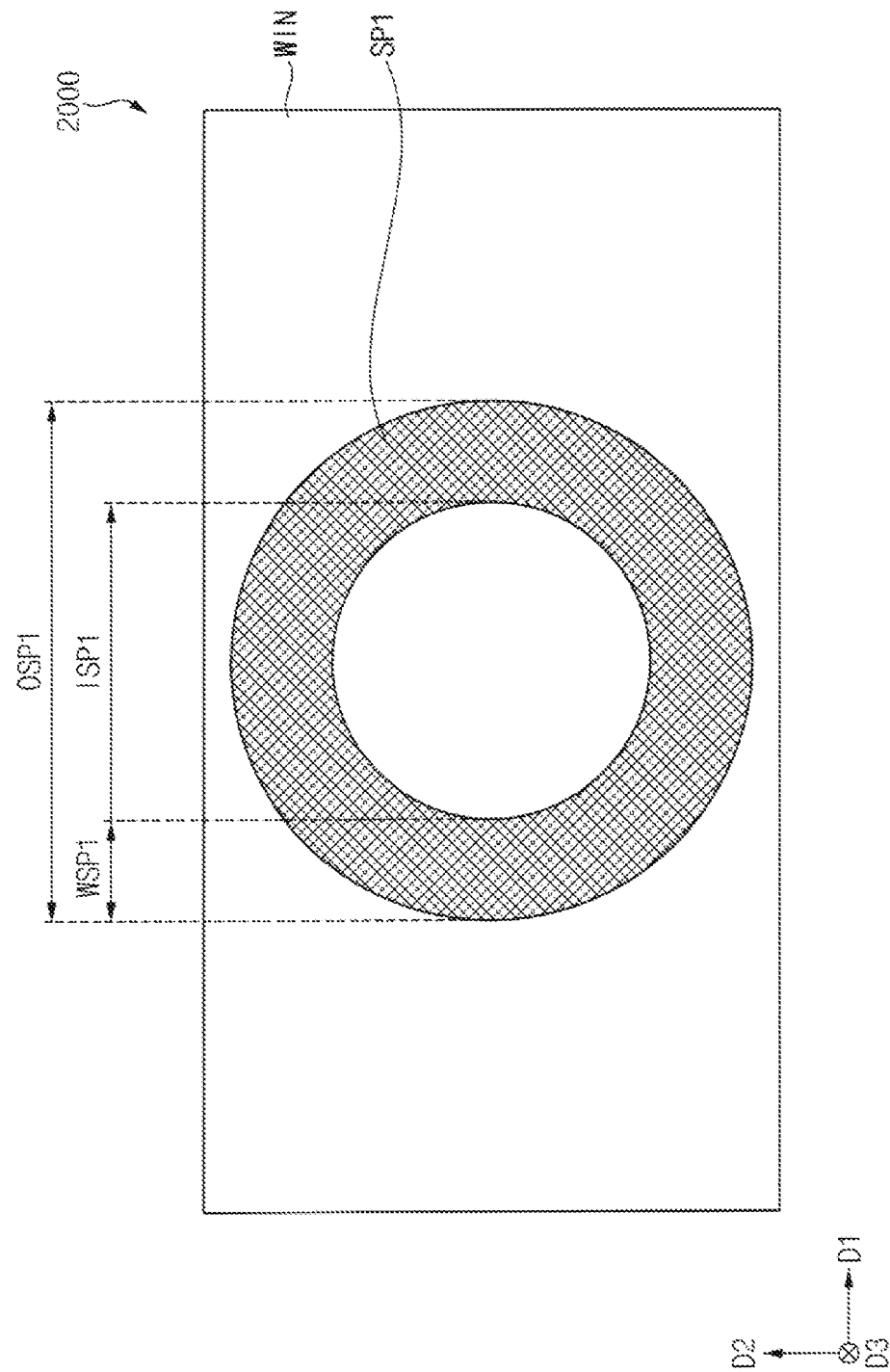
FIG. 10, FIG. 11, and FIG. 12 are schematic plan views illustrating a method of manufacturing the display device of FIG. 3.
Figure 11:
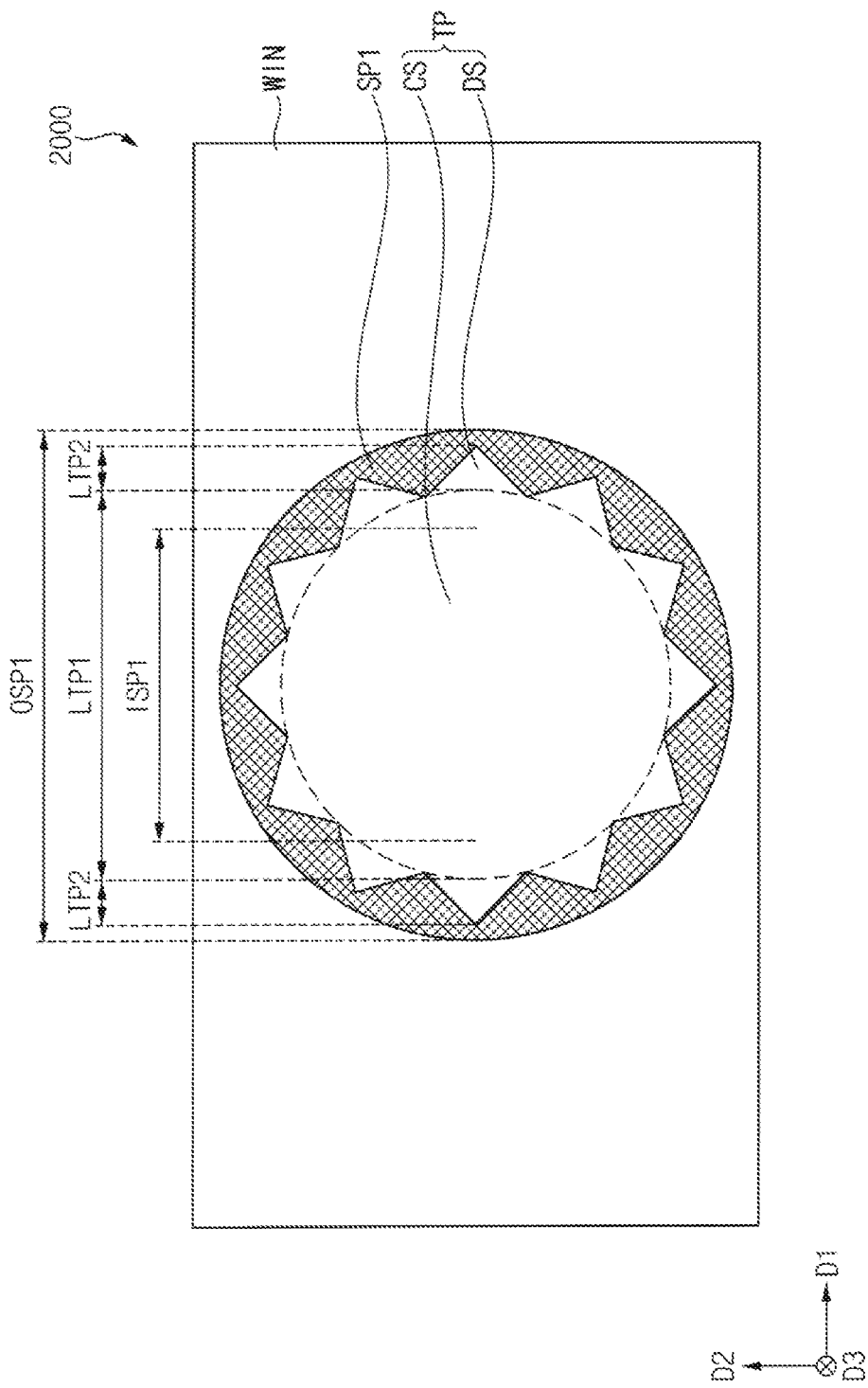
Figure 12:
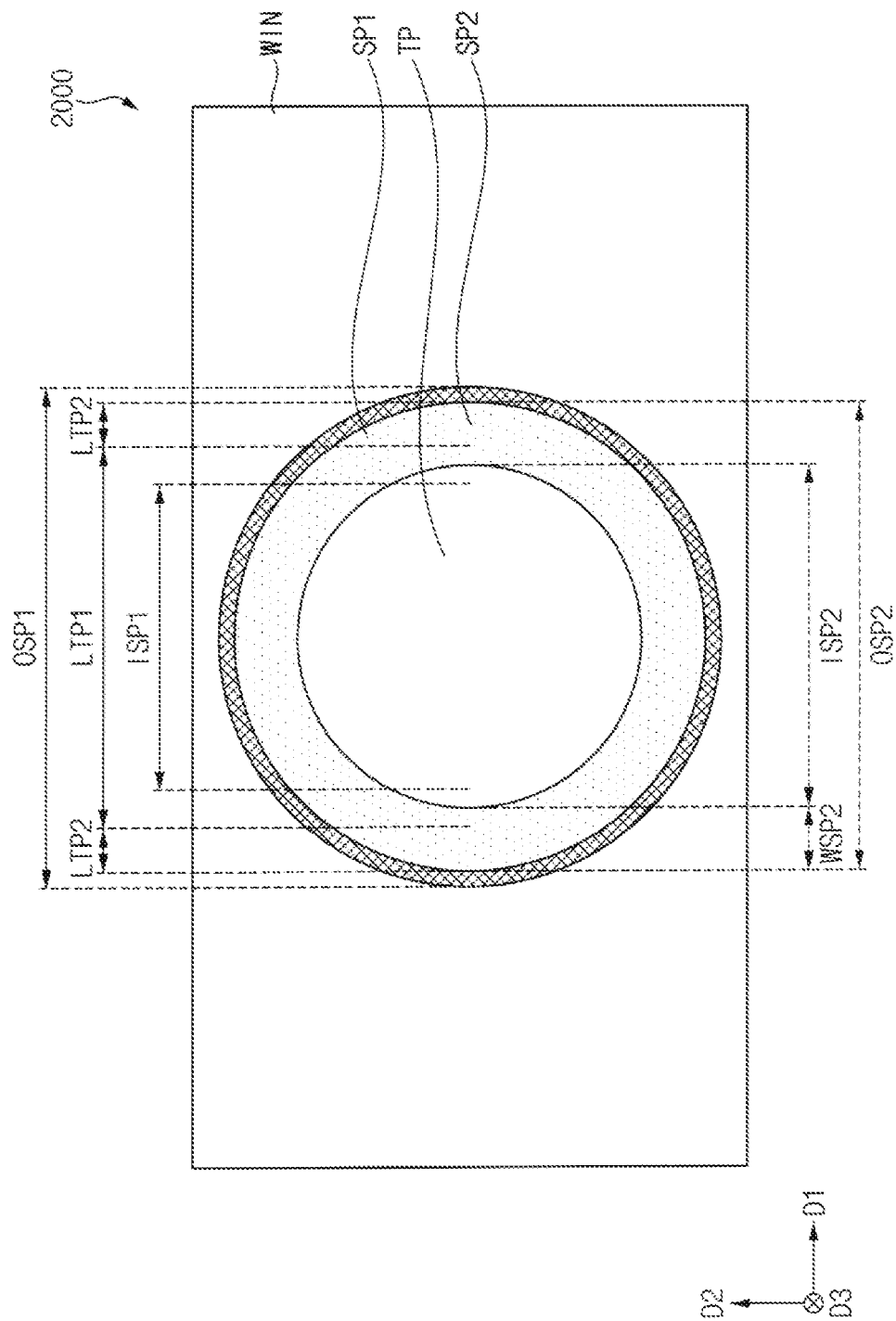

FIG. 6, FIG. 7, FIG. 8, and FIG. 9 are schematic cross-sectional views illustrating a method of manufacturing the display device of FIG. 3. FIG. 10, FIG. 11, and FIG. 12 are schematic plan views illustrating a method of manufacturing the display device of FIG. 3. FIG. 10 is a schematic plan view of a window and a first light blocking pattern of FIG. 6 as viewed in a third direction D3 (for example, -Z direction), FIG. 11 is a schematic plan view of a window, a first light blocking pattern, and a transparent pattern of FIG. 7 as viewed in the third direction D3, and FIG. 12 is a schematic plan view of a window, a first light blocking pattern, a transparent pattern, and a second light blocking pattern of FIG. 8 as viewed in the third direction D3.

Figure 6:
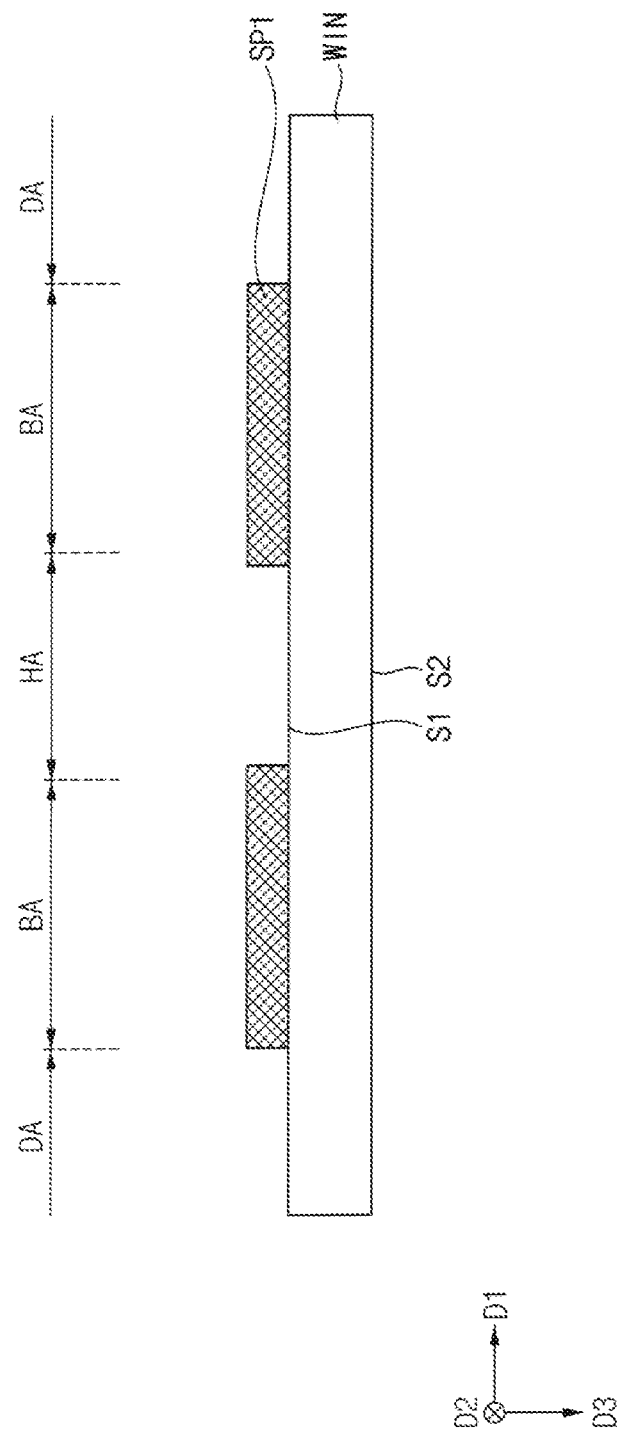
FIG. 6, FIG. 7, FIG. 8, and FIG. 9 are schematic cross-sectional views illustrating a method of manufacturing the display device of FIG. 3.

Referring to FIGS. 6 and 10, the first light blocking pattern SP1 may be formed on the first surface S1 of the window WIN to overlap the boundary area BA.

As shown in FIG. 10, the first light blocking pattern SP1 may have a first donut or torus or annular shape. The first light blocking pattern SP1 may be formed to have a first outer diameter OSP1, a first inner diameter ISP1, and a first width WSP1. For example, the first outer diameter OSP1 may be defined as a maximum length of the first light blocking pattern SP1 in a first direction D1 (for example, X direction)(or a second direction D2 (for example, Y direction)), the first inner diameter ISP1 may be defined as a minimum length of the first light blocking pattern of the first light blocking pattern SP1 in the first direction D1 (or the second direction D2), and the first width WSP1 may be a value obtained by dividing a difference between the first outer diameter OSP1 and the first inner diameter ISP1 in half.

Figure 7:
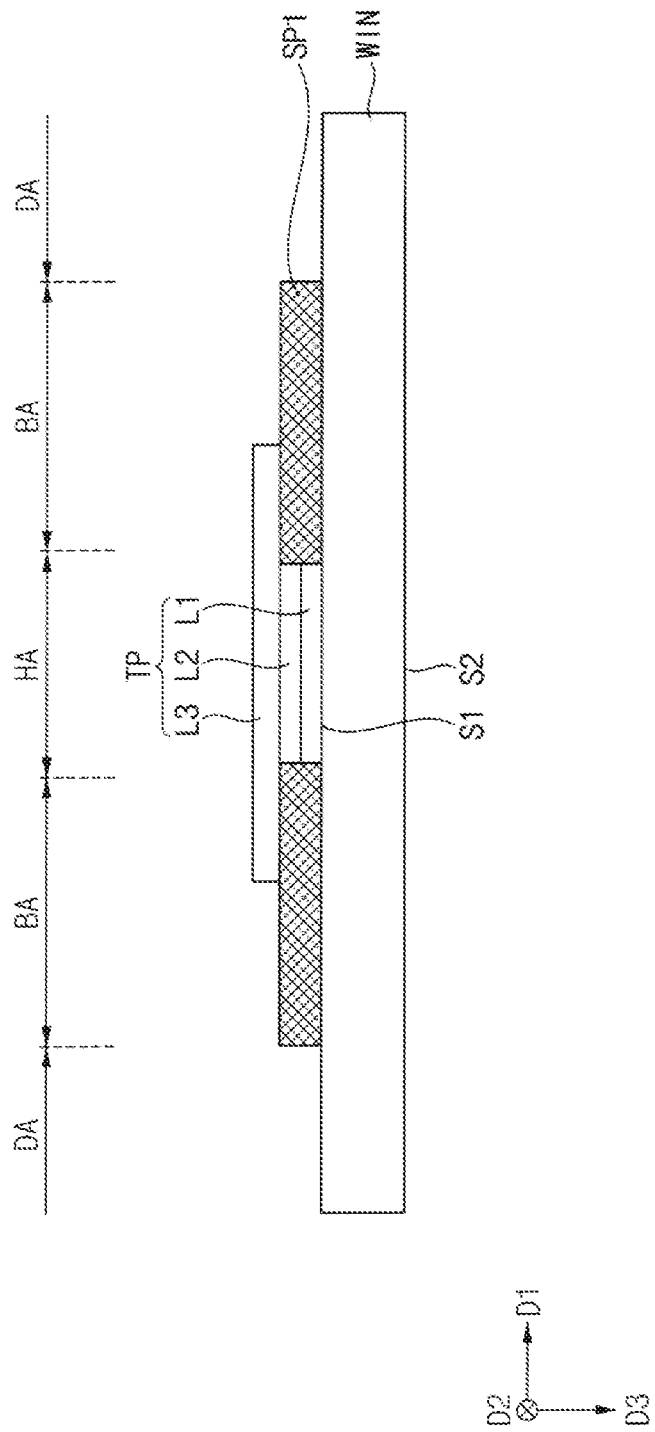

Referring to FIGS. 7 and 11, the transparent pattern TP may be formed on the first light blocking pattern SP1 to overlap the hole area HA. As described above, the transparent pattern TP may include a first silicon oxide layer L1, a titanium oxide layer L2, and a second silicon oxide layer L3. The first silicon oxide layer L1 may contact the window WIN. Accordingly, the transparent pattern TP may be stably attached to the window WIN.

In an embodiment, the transparent pattern TP may be coated through a deposition process. Examples of the deposition process may be a chemical vapor deposition ("CVD") process, a plasma enhanced CVD ("PECVD") process, a low pressure CVD process ("LPCVD"), a physical vapor deposition process ("PVD"), sputtering, atomic layer deposition ("ALD"), and the like within the spirit and the scope of the disclosure.

A film mask may be used to deposit a material used for the transparent pattern TP. Accordingly, a shadow may be formed on the transparent pattern TP. For example, as shown in FIG. 11, the transparent pattern TP may have a circular shape CS and a sawtooth shape DS. The sawtooth shape DS may be disposed to surround the circular shape CS. The circular shape CS may have a diameter LTP1. The sawtooth shape DS may have a sawtooth length LTP2. The sawtooth length LTP2 may be defined as a length in which the sawtooth shape DS protrude from the circular shape CS in the first direction D1 (or the second direction D2). The sawtooth length LTP2 may be greater than about 0.05 mm and less than about 1 mm. The maximum length of the transparent pattern TP may be defined as a sum of the diameter LTP1 and twice of the sawtooth length LTP2 (=LTP1+2×LTP2).

In an embodiment, the diameter LTP1 may be greater than or equal to the first inner diameter ISP1. In other words, the circular shape CS may partially overlap the first light blocking pattern SP1.

Figure 8:
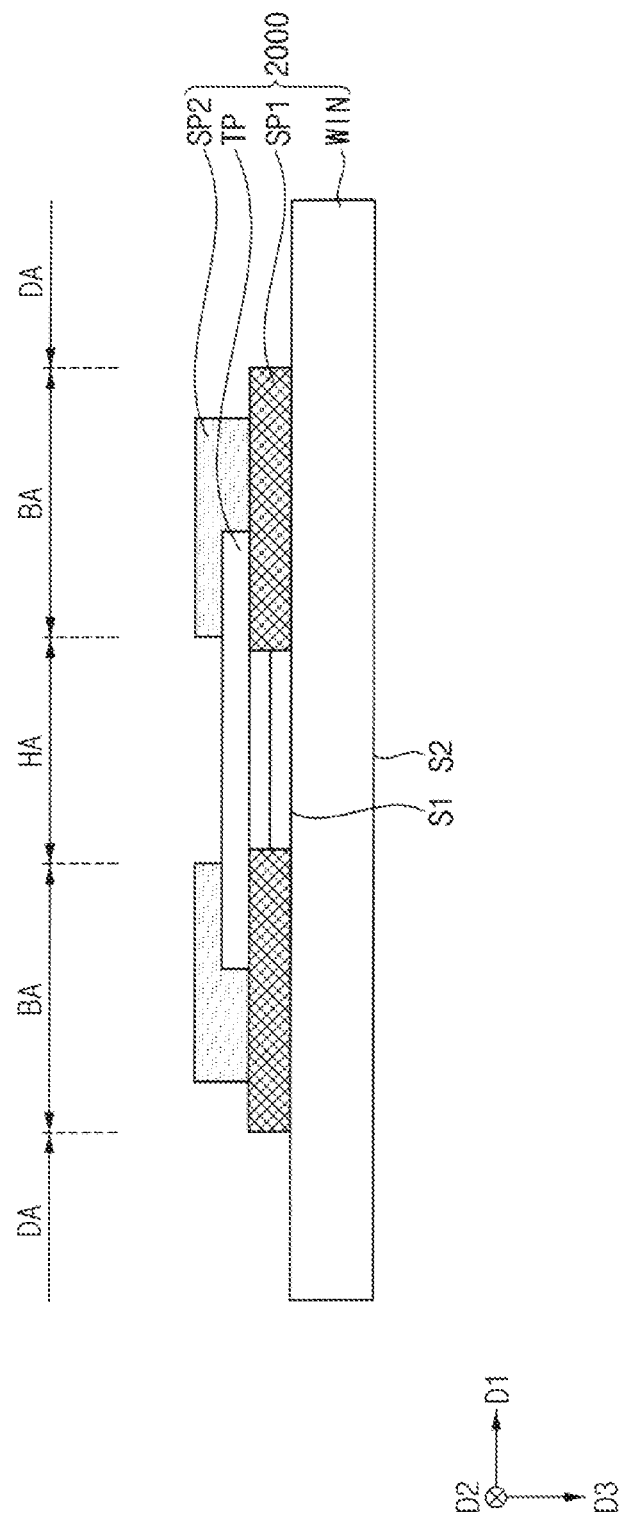

Referring to FIGS. 8 and 12, the second light blocking pattern SP2 may be formed on the transparent pattern TP to overlap the boundary area BA.

As shown in FIG. 12, the second light blocking pattern SP2 completely may cover or overlap the sawtooth shape DS and may have a second donut or torus or annular shape. The second light blocking pattern SP2 may be formed to have a second outer diameter OSP2, a second inner diameter ISP2, and a second width WSP2. For example, the second outer diameter OSP2 may be defined as a maximum length of the second light blocking pattern SP2 in the first direction D1 (or the second direction D2), the second inner diameter ISP2 may be defined as the minimum length of the second light blocking pattern SP2 in the first direction D1 (or the second direction D2), and the second width WSP2 may be a value obtained by dividing a difference between the second outer diameter OSP2 and the second inner diameter ISP2 in half.

In an embodiment, the second outer diameter OSP2 may be less than or equal to the first outer diameter OSP1. The second inner diameter ISP2 may be greater than or equal to the first inner diameter ISP1.

In an embodiment, the maximum length of the transparent pattern TP may be less than or equal to the second outer diameter OSP2. The diameter LTP1 may be greater than or equal to the second inner diameter ISP2, and the sawtooth length LTP2 may be less than or equal to the second width WSP2. Accordingly, the sawtooth shape DS may be completely covered or overlapped by the second light blocking pattern SP2. The second blocking pattern SP2 may be adhered to the first blocking pattern SP1 in the boundary area BA.

Figure 9:
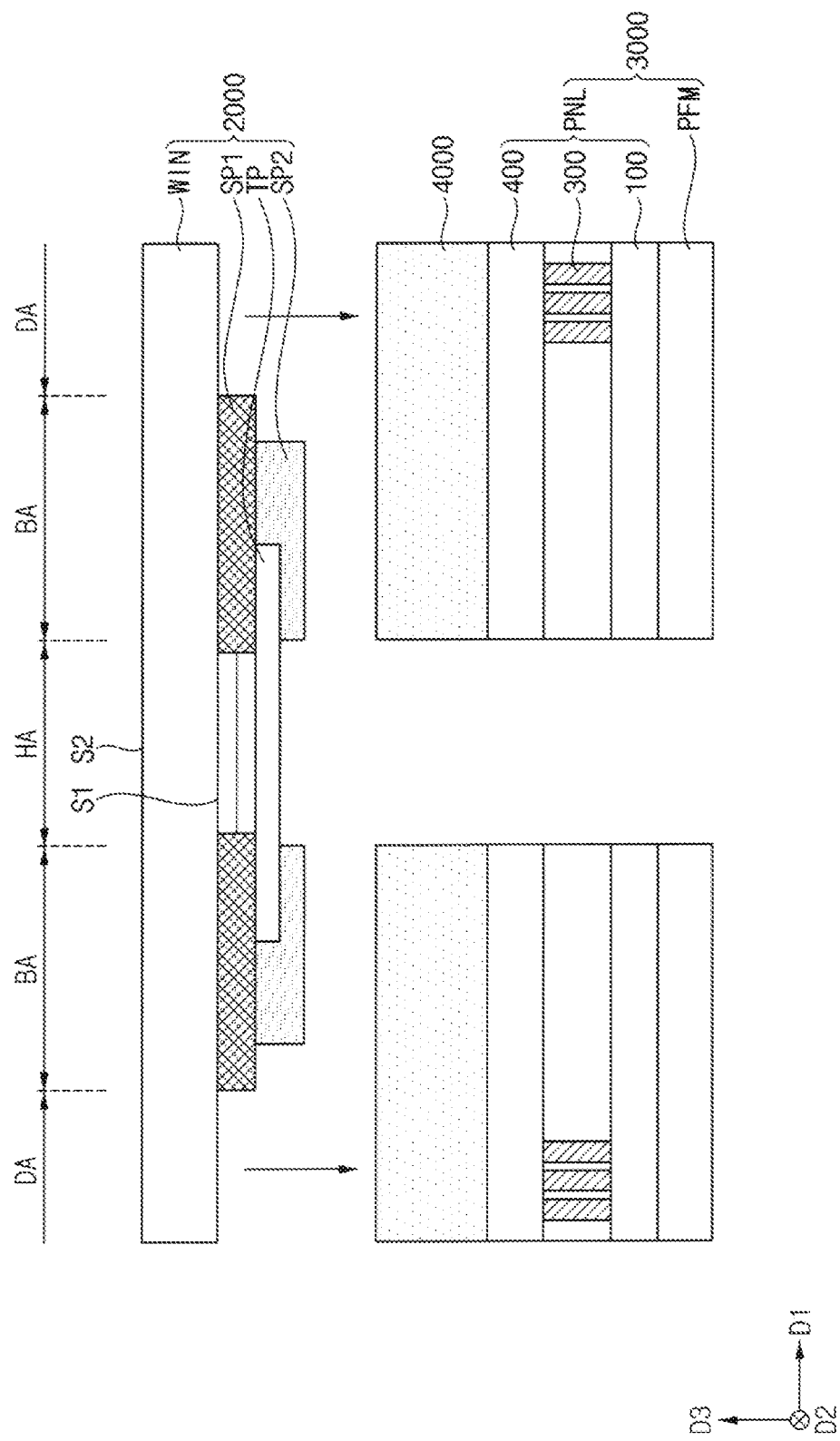

Referring to FIG. 9, the window module 2000 may be adhered to the lower structure 3000 on which the adhesive layer 4000 is formed.

According to the above-described method of manufacturing the display device 1000, the transparent pattern TP may be formed after the first light blocking pattern SP1 is formed, and the second light blocking pattern SP2 may be formed after the transparent pattern TP is formed. As the first light blocking pattern SP1 is formed between the window WIN and the transparent pattern TP, the sawtooth shape DS of the transparent pattern TP may not be viewed through the window WIN. As the sawtooth shape DS is completely covered or overlapped by the first light blocking pattern SP1 and the second light blocking pattern SP2, bubbles may not be generated while the window module 2000 is adhered to the lower structure 3000. As the display device 1000 may include the transparent pattern TP, the transmittance of external light incident to the hole area HA may be increased.

Figure 13:
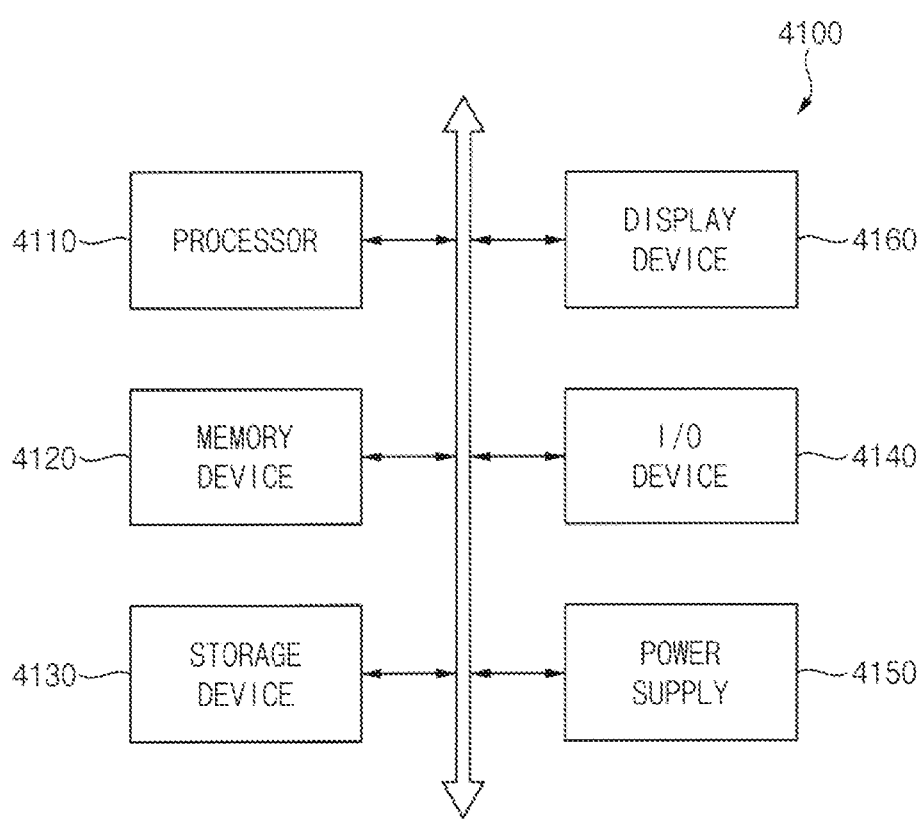
FIG. 13 is a block diagram illustrating an electronic device including the display device of FIG. 1.

FIG. 13 is a block diagram illustrating an electronic device including the display device of FIG. 1.

Referring to FIG. 13, an electronic device 4100 may include a processor 4110, a memory device 4120, a storage device 4130, an input/output device 4140, a power supply 4150, and a display device 4160.

The electronic device 4100 may further include various ports capable of communicating with a video card, a sound card, a memory card, a USB device, or the like, or communicating with other systems.

The processor 4110 may perform various computing functions. In an embodiment, the processor 4110 may be a microprocessor, a central processing unit ("CPU"), an application processor ("AP"), or the like within the spirit and the scope of the disclosure. The processor 4110 may be connected or coupled to other components via an address bus, a control bus, a data bus, or the like within the spirit and the scope of the disclosure. In an embodiment, the processor 4110 may be coupled or connected to an extended bus such as a peripheral component interconnection ("PCI") bus.

The memory device 4120 may store data for operations of the electronic device DD. In an embodiment, the memory device 4120 may include at least one non-volatile memory device such as an erasable programmable read-only memory ("EPROM") device, an electrically erasable programmable read-only memory ("EEPROM") device, a flash memory device, a phase change random access memory ("PRAM") device, a resistance random access memory ("RRAM") device, a nano floating gate memory ("NFGM") device, a polymer random access memory ("PoRAM") device, a magnetic random access memory ("MRAM") device, a ferroelectric random access memory ("FRAM") device, or the like, and/or at least one volatile memory device such as a dynamic random access memory ("DRAM") device, a static random access memory ("SRAM") device, a mobile DRAM device, or the like within the spirit and the scope of the disclosure.

The storage device 4130 may include a solid state drive ("SSD") device, a hard disk drive ("HDD") device, a CD-ROM device, or the like within the spirit and the scope of the disclosure. In an embodiment, the I/O device 4140 may include an input device such as a keyboard, a keypad, a mouse device, a touchpad, a touch-screen, or the like, and an output device such as a printer, a speaker, or the like within the spirit and the scope of the disclosure. The power supply 4150 may provide power for operations of the electronic device 4100. The display device 4160 may be connected or coupled to other components via the buses or other communication links.

The electronic device 4100 may be any electronic device including the display device 4160 such as a mobile phone, a smart phone, a tablet computer, a digital TV, a 3D TV, a personal computer ("PC"), a home electronic device, a laptop computer, personal digital assistant ("PDA"), a portable multimedia player ("PMP"), a digital camera, a music player, a portable game console, a navigation, and the like within the spirit and the scope of the disclosure.

Although embodiments and implementations have been described herein, other embodiments and modifications will be apparent from this description. Accordingly, the disclosure is not limited to such embodiments, but rather to the broader scope of the appended claims and various modifications and equivalent arrangements as would be apparent to a person of ordinary skill in the art.

What is claimed is:

1. A method of manufacturing a display device, the method comprising:
    preparing a window including a hole area, a boundary area surrounding the hole area, and a display area surrounding the boundary area;
    forming a first light blocking pattern on the window, the first light blocking pattern overlapping the boundary area in a plan view and blocking light;
    forming a transparent pattern on the first light blocking pattern, the transparent pattern overlapping the hole area in a plan view and transmitting light; and
    forming a second light blocking pattern on the transparent pattern, the second light blocking pattern overlapping the boundary area in a plan view and blocking light,
    wherein the second light blocking pattern contacts both the transparent pattern and the first light blocking pattern.

2. The method of claim 1, wherein
    the transparent pattern is formed after the first light blocking pattern is formed, and
    the second light blocking pattern is formed after the transparent pattern is formed.

3. The method of claim 1, wherein the first light blocking pattern, the transparent pattern, and the second light blocking pattern overlap each other in a plan view in the boundary area of the window.

4. The method of claim 1, wherein the transparent pattern is formed between the first light blocking pattern and the second light blocking pattern in the boundary area of the window.

5. The method of claim 1, wherein the transparent pattern is exposed in the hole area of the window.

6. The method of claim 1, wherein the transparent pattern has a substantially circular shape and a substantially sawtooth shape surrounding the substantially circular shape in a plan view.

7. The method of claim 6, wherein
    the first light blocking pattern has a substantially first donut shape in a plan view, and
    the second light blocking pattern has a substantially second donut shape in a plan view.

8. The method of claim 7, wherein a diameter of the substantially circular shape of the transparent pattern is greater than or equal to an inner diameter of the first light blocking pattern.

9. The method of claim 7, wherein a maximum length of the transparent pattern is less than or equal to an outer diameter of the second light blocking pattern.

10. The method of claim 7, wherein a length of the substantially sawtooth shape of the transparent pattern is less than or equal to a width of the second light blocking pattern.

11. The method of claim 7, wherein an outer diameter of the second light blocking pattern is less than or equal to an outer diameter of the first light blocking pattern.

12. The method of claim 7, wherein an inner diameter of the second light blocking pattern is greater than or equal to an inner diameter of the first light blocking pattern.

13. The method of claim 7, wherein a length of the substantially sawtooth shape of the transparent pattern is greater than about 0.05 mm and is less than about 1 mm.

14. The method of claim 1, wherein
    the transparent pattern includes silicon oxide layers and titanium oxide layers alternately stacked, and
    the window contacts at least one of the silicon oxide layers.

15. The method of claim 1, further comprising:
    adhering the window to the display panel so that the display panel faces the transparent pattern.

16. The method of claim 15, wherein a hole is formed in the display panel overlapping the hole area of the window in a plan view.

17. A display device comprising:
- a window including a hole area, a boundary area surrounding the hole area, and a display area surrounding the boundary area;
- a display panel disposed below the window and including a hole overlapping the hole area of the window in a plan view;
- a first light blocking pattern disposed between the window and the display panel, and overlapping the boundary area in a plan view;
- a transparent pattern disposed between the window and the display panel, and overlapping the hole area in a plan view; and
- a second light blocking pattern disposed between the first light blocking pattern and the display panel, and overlapping the boundary area in a plan view,
- wherein the second light blocking pattern contacts both the transparent pattern and the first light blocking pattern.

18. The display device of claim 17, wherein the first light blocking pattern, the transparent pattern, and the second light blocking pattern overlap each other in the boundary area of the window in a plan view.

19. The display device of claim 17, wherein the transparent pattern is formed between the first light blocking pattern and the second light blocking pattern in the boundary area of the window.

* * * * *